United States Patent [19]

Uhlig

[11] 4,034,183
[45] July 5, 1977

[54] PROCESS FOR THE PRODUCTION OF PLANOGRAPHIC PRINTING FORMS BY MEANS OF LASER BEAMS

[75] Inventor: Fritz Uhlig, Wiesbaden, Germany

[73] Assignee: Hoechst Aktiengesellschaft, Germany

[22] Filed: Oct. 8, 1975

[21] Appl. No.: 620,756

[30] Foreign Application Priority Data

Oct. 10, 1974 Germany .......................... 2448325

[52] U.S. Cl. ....................................... 219/122 LM
[51] Int. Cl.$^2$ .......................................... B23K 9/00
[58] Field of Search ... 219/121 LM, 121 L, 121 EB, 219/121 EM; 346/1, 76 L; 96/1 R, 48 HD, 68, 27

[56] References Cited

UNITED STATES PATENTS 3,787,873  1/1974  Sato et al. ............... 219/121 LM X Primary Examiner—J. V. Truhe
Assistant Examiner—Fred E. Bell
Attorney, Agent, or Firm—James E. Bryan

[57] ABSTRACT

This invention relates to an improvement in the process for the production of a planographic printing form in which a carrier coated with a hydrophilic layer composed of a non-light-sensitive compound is imagewise exposed, the improvement comprising imagewise exposing the layer to laser radiation, whereby the material obtained may be used for printing in a planographic printing machine without further treatment.

8 Claims, No Drawings

PROCESS FOR THE PRODUCTION OF PLANOGRAPHIC PRINTING FORMS BY MEANS OF LASER BEAMS

The present invention relates to a process for the production of a planographic printing form in which a carrier having a hydrophilic layer thereon is imagewise exposed to a laser beam and oleophilic image areas are thereby produced.

During the photomechanical production of planographic printing forms, a recording material having a light-sensitive layer is usually imagewise exposed to light and then developed with a suitable developer solution, whereby oleophilic image areas and hydrophilic non-image areas are obtained. The oleophilic image areas of the layer usually remain after the development, whereas the non-image areas are generally dissolved away during the development, leaving the carrier surface bared.

For development, organic solvents or alkaline or acidic aqueous solutions are usually used, according to the nature of the layer. In working with these solutions, certain safety measures, for example, distillation or neutralization, must be observed. It would be desirable, therefore, to eliminate such developer solutions. It already has been proposed, for example in U.S. Pat. Nos. 3,220,832; 3,396,019 and 3,276,868, to develop exposed presensitized offset printing forms by wiping them over with pure water. In this process, however, it is always necessary to use light-sensitive copying layers, which can be stored for only a limited time and still can be exposed after having been stored slightly too long, but no longer can be developed with pure water. In any case, in this process also, the washed-out parts of the light-sensitive layer, which contain for example diazonium salts, acids, or metal salts, must be removed.

Furthermore, it has been suggested, in German Offenlegungsschrift No. 2,231,815, to expose a recording material composed of a carrier and a non-light-sensitive layer to electron radiation and to develop the material with water or aqueous solution; offset printing forms can be produced by this process. However, it is a disadvantage, particularly with larger forms, that the exposure to electron radiation requires expensive apparatuses and must be carried out in a high vacuum.

In copending application Ser. No. 495,504 filed Aug. 7, 1974 a process for the production of planographic printing plates was suggested in which a carrier coated with a non-light-sensitive layer was imagewise exposed to electron radiation and then directly used for printing in an offset printing machine.

In German Auslegeschrift No. 1,263,091 an apparatus is described, preferably an apparatus for recording television images on vapor-treated films (films treated with vapor deposition) having a thickness of about 5 μm, in which laser beams vaporize very thin metal layers of a thickness of about 0.05 μm. Such material, however, would be useless for offset printing.

U.S. Pat. No. 3,836,709 describes a process for the production of a polymeric image by means of laser beams, but for this purpose a layer having a photohardenable composition is required.

In German Auslegeschrift No. 1,571,833, a process for the production of planographic printing forms or hectographic printing forms is described in which a laser beam or a bundle of electrons destroys a silicon layer having poor adhesion.

In U.S. Pat. No. 3,664,737, a printing plate is described which carries a light-sensitive layer, preferably a diazo layer and which is exposed to a laser.

The object of the present invention is to provide a process for the production of planographic printing forms by imagewise exposure to radiation without high vacuum, for which no light-sensitive material and no step of development are necessary.

The subject of the invention is a process for the production of planographic printing forms in which a carrier coated with a hydrophilic layer composed of a non-light-sensitive compound is imagewise exposed. In the process, the layer is imagewise exposed to a laser beam and the exposed material thus obtained is used in a planographic printing machine without further treatment.

The process of the invention provides a new and unusually simple means of producing planographic printing forms. The recording material used in this process is insensitive to daylight and artificial light as well as to aging. It has practically an unlimited storage life. The only processing step is the imagewise exposure of the material to laser radiation. Thus the hydrophilic surface layer is hardened in the exposed areas or otherwise altered so that it becomes hydrophobic or oleophilic and absorbs printing ink.

The exposed plate may be put into an offset printing machine without further treatment, and oily or greasy printing ink and fountain solution may be applied in the usual manner. If the original surface layer was water-soluble, this layer can be removed by the fountain solution; in this case the carrier surface underneath also must be hydrophilic. If the hydrophilic layer is insoluble in water, practically no removal of substance by the fountain solution takes place, the unexposed areas serving directly as the image background.

By means of exposure to laser radiation, a lasting oleophilization of the hydrophilic surface can be achieved, so that very often large numbers of prints can be obtained from a particular form. Various materials may be employed for the hydrophilic layer used in the process of the invention.

Advantageously, the layer may be composed of a water-soluble organic substance, which may be monomeric or polymeric, and which is obtainable in the form of an even, thin and non-crystallizing film.

Suitable water-soluble polymers are, for example, polyvinyl alcohol, polyvinyl pyrrolidone, polyalkylene oxides, polyalkylene imines, cellulose ether as well as carboxymethyl cellulose or hydroxyethyl cellulose, polyacrylamide, polyacrylic acid, polymethacrylic acid, starch, wheat gluten, dextrin, casein, gelatin, gum arabic and tannin. In order to increase the sensitivity to radiation of these polymers, sensitizers may be added, e.g. the dyes Crystal Violet, Rhodamine, Astrazon orange and eosin. The portion of the layer of sensitizer may in general be between 1 and 80 percent, preferably between 10 and 50 percent by weight.

Suitable monomeric or low-molecular weight water-soluble substances are for example water-soluble dyes such as Rhodamine B, 6G, and 6 GDN extra, Methylene Blue, Astrazon orange R, eosin or triphenyl methane dyes, for example Crystal Violet, as well as the film-forming low-molecular weight organic substances described in U.S. Pat. No. 3,753,715. Above all, monomeric and oligomeric carbohydrates belong to them, including their reduction and oxidation products, esters, ethers, salts and the like, for example arabitol, sorbitol, pentaerythritol, gluconic acid, and galactonic acid, as well as the alkali and ammonium salts thereof, glucose, galactose, fructose, mannose, arabinose, saccharose, lactose and maltose. Wetting agents, for example saponins, sodium salts of alkylated sulfosuccinic acids and of alkylated arylsulfonic acids, polyglycols, polyglycolalkylphenolethers and the like also may be used.

It is also advantageous to use water-insoluble hydrophilic layers, which may be of inorganic and organic nature.

Suitable organic water-insoluble hydrophilic substances are, for example, association products of phenolic resins and polyethylene oxides as described in German Offenlegungsschrift No. 1,447,978, hardened melamine-formaldehyde resins according to U.S. Pat. No. 3,161,518, or amine urea-formaldehyde resins as described in German Auslegeschrift No. 1,166,217; cross-linked hydrophilic colloids, for example, cross-linked polyvinyl alcohol, which may contain hydrophilic inorganic pigments, also may be used.

In addition, water-insoluble hydrophilic inorganic pigment layers are suitable, the pigment being embedded in the surface of the carrier, which may be, for example, a plastic sheet or a paper with a plastic surface, e.g. layers made of pyrogenic silicic acid.

An important group of water-insoluble hydrophilic layers which can be used in accordance with the invention are the layers obtained by the reaction of metal surfaces, particularly aluminum surfaces, with monomeric or polymeric organic or inorganic acids or their salts, or with certain complex acids or complex salts. Such layers are well known in planographic printing and are commonly used for the pretreatment of metal carriers for light-sensitive layers. Examples of suitable treating agents are alkali silicates (U.S. Pat. No. 2,714,066, phosphonic acids or their derivatives (U.S. Pat. Nos. 3,220,832; 3,276,868), titanium or zirconium hexahalides (U.S. Pat. No. 2,946,683,) organic polyacids (U.S. Pat. Nos. 2,714,066 and 3,166,636), and monomeric carboxylic acids or their derivatives, phosphomolybdates, silicomolybdates, and the like. For the purpose of this invention, however, treating solutions which have higher concentrations of the substances given than usual are generally used, preferably solutions with a content of about 1 to 15 percent by weight.

In general the hydrophilic layers must, according to the invention, fulfill the condition that during the planographic or offset printing process, with the simultaneous action of printing ink based on oil and of fountain solution, they are wetted only by the latter. Layers with this property are sufficiently known as carriers or background surfaces for planographic printing plates. Moreover, as mentioned above, layers of water-soluble film-forming organic substances fulfill this condition as well.

The hydrophilic layers also must have the capacity, under exposure to laser radiation, of altering their surface tension towards water and printing ink in such a manner that they are no longer wetted by water, but only by printing ink based on oil or fat, i.e. that they become hydrophobic or oleophilic.

Suitable carriers for the hydrophilic layers are the materials commonly used in planographic printing, e.g. paper coated with cellulose acetate, zinc, magnesium, aluminum, chromium, steel, multimetals, plastics or plastic/metal composite foils or films. Aluminum, preferably roughened mechanically, chemically or by means of electric current and/or anodized, is preferably used. If water-soluble hydrophilic layers are used, it is necessary for the carrier surface to be permanently hydrophilic.

Although no definite conclusions on the nature of the change caused by laser radiation exist, it is assumed that polymerization or cross-linking takes place, while hydrophilic groups, particularly OH-groups, are split-off or changed into hydrophobic groups.

Lasers suitable for the purposes of the present invention are efficient lasers having shorter wave lengths, for example Ar-lasers, krypton-ion lasers, dye lasers, helium/cadmium lasers which emit between 300 and 600 nm, but for some layers $CO_2$-lasers are suitable, which emit at 10.6 $\mu$m.

The laser beam is controlled by a predetermined linear and/or screen movement. Processes and apparatuses for controlling the laser beam by means of computers, as well as focusing, modulation or deflection of the beam are not part of the invention. They have been described several times, for example in U.S. Pat. Nos. 3,751,587; 3,745,586; 3,747,117; 3,475,760; 3,506,779, 3,664,737, and 3,836,709.

The hydrophilic layers are preferably imagewise exposed to the radiation of an argon laser of 3 to 30 watts or of a $CO_2$ laser. Depending upon the sensitivity or absorption capacity of the hydrophilic layers used, speeds of 2 to 400 cm per second and more are achieved. By focusing the laser beam by means of optics, focal spots having a diameter of less than 50 $\mu$m are produced on the hydrophilic layer. Since the layers are non-light-sensitive, even to UV-light, exposure can be carried out in daylight.

The process of the invention has the special advantage that the imagewise exposed carrier can be put immediately, or after being stored for any time desired, into an offset printing machine and printing can be started at once. The need for development or decoating of the imagefree areas of the carrier, as is necessary for customer-coated and presensitized offset printing plates and is often carried out in bulky and expensive developing machines, is completely eliminated. This advantage considerably supports the efforts made to speed up and rationalize offset printing.

When the exposed materials are processed in an offset printing machine, printing may be carried out either according to the dry offset process or in the presence of fountain solution. When the hydrophilic non-image areas are wetted by fountain solution, either no material at all is removed (water-insoluble layers), or only relatively small quantities are removed by the fountain solution (water-soluble layers), which in many cases easily can be removed and discharged into the sewage system without substantial risk of environmental pollution. In contrast to this, the development of light-sensitive layers generally produces considerably more pollutant substances, the disposal of which generally requires additional steps in order not to endanger the environment.

The following examples further illustrate the invention. Unless otherwise stated, percentages are by weight; 1 part by weight is equal to 1 g when 1 part by volume is equal to 1 ml.

EXAMPLE 1

A paper film suitable for use as a printing plate and coated with a coating composed of a hydrophilic colloidal binder having a finely divided inorganic pigment according to the information given in U.S. Pat. No. 2,534,588, is imagewise exposed, over all spectral lines, to an argon/krypton laser having an overall efficiency of about 2.3 watts. In the case of a current of 30 amperes and about 2640 m watts, exposure to radiation is carried out at a speed of more than 10 cm/sec.

By focusing the beam by means of optics, a focal spot having a diameter of about 7 $\mu$m is produced in the case of a power density of about 7.5 megawatts/cm$^2$.

The exposed areas have a visibly darker color. Without further processing steps, the printing film is put into an offset printing machine and printing is begun, the exposed area accepting fatty printing ink. Up to 10,000 prints are obtained, depending upon the tensile strength of the paper carrier.

The same good results are obtained if, instead of the pure paper printing film described above, a paper printing film is used which has an intermediate layer composed of aluminum, as is sold by Messrs. S. D. Warren under the name FOTORAMIC.

EXAMPLE 2

A polyethylene terephthalate film provided with a hydrophilic adhesive layer according to the information given in U.S. Pat. No. 3,396,046, is imagewise exposed to an argon laser having a current of 25 amperes and a light performance of 1970 m watts. The exposed areas are visibly darker than the light background.

Printing may be begun at once in an offset printing machine, and about 35,000 good prints are obtained. Similar good results are obtained if work is carried out with a current of 20 amperes and 1265 m watts or with 15 amperes and 540 m watts instead of the current of 25 amperes given above.

EXAMPLE 3

A mechanically roughened aluminum plate is coated with a two percent concentration aqueous Crystal Violet solution, dried, and imagewise exposed to an argon laser. The printing plate is then put into an offset printing machine and wiped over with a moist sponge. The water-soluble dye layer, which can be removed with water, is thus removed in the non-exposed areas whereas it is hardened and oleophilic in the exposed areas.

The wiping-over with a moist sponge is not necessary, but in the course of time the machine may be contaminated by the dye residues if the plate is used without previous wiping over.

Instead of Crystal Violet, the dyes auramine orange, Astrazon orange R, Rhodamine B, 6 G or 6 GDN, Methylene Blue and eosin may be used in the same concentration and with the same success, or the dye Hansa yellow 5G = pigment yellow 5 (Color Index, page 2705, No. 11,660) in an approximately 0.5 percent concentration solution in cyclohexanone for coating aluminum and for exposure to radiation.

EXAMPLE 4

A mechanically roughened aluminum plate is coated with a solution of a 3 percent of maltose and 1 percent of Rhodamine B, dried, exposed to the laser and printing is begun without further steps in an offset printing machine.

EXAMPLE 5

In a continuous process, a roll of smooth rolled aluminum is roughened and anodized, coated with a 5 percent solution of polyvinyl pyrrolidone in water, and dried.

The non-light-sensitive material is cut into forms and imagewise exposed to the argon laser, as described in Example 1. After exposure, the aluminum film is put in an offset printing machine and printing is begun immediately.

Similar results are obtained if, instead of polyvinyl pyrrolidone, its mixed polymerizates or casein or 5 percent tannin dissolved in water are used for the coating.

EXAMPLE 6

A paper printing film coated with zinc oxide, as sold for electrostatic copying under the trade mark ELFASOL$^{(R)}$ paper printing film L 13, is exposed to an argon laser at a current of 15 amperes. The image areas struck by the beam are distinctly visible. The film is then put into an offset machine. It is suitable to use as an offset wiping water the OZASOL$^{(R)}$ wiping water RC 64, which is recommended for this paper printing plate. Several thousand clean prints free from scum are obtained before the paper film breaks.

EXAMPLE 7

An Al/Cr plate is coated with an aqueous solution of 3 percent of polyvinyl alcohol (PVA having the trade mark MOWIOL$^{(R)}$ 66–100) and 1 percent of Crystal Violet and exposed to an Ar-laser.

Then printing is begun immediately, as described above. Similar results are obtained if, instead of polyvinyl alcohol a 6 percent solution of dextrin, an 18 percent solution of gum arabic, a 5 percent solution of starch or an 0.1 percent solution of hydroxyethyl cellulose is used for the coating and eosin is used instead of Crystal Violet.

EXAMPLE 8

An anodized aluminum plate is coated with a 2.5 percent solution of polyacrylic acid and exposed to a 200 watt CO$_2$ laser. By focusing by means of optics, a focal spot having a diameter of less than 50 $\mu$m is obtained at a power density of 10 megawatts/cm$^2$. The printing is begun immediately, as described above. Similar results are obtained if, instead of polyacrylic acid, a 5 percent solution of polyethylene glycol having a medium molecular weight of 3900 – 4800 is used.

EXAMPLE 9

An anodized aluminum plate is coated by dipping it into an aqueous solution of 10 percent of polyvinyl phosphonic acid and 1 percent of Rhodamine 6G having a temperature of 80° C, then dried and imagewise exposed to a CO$_2$ laser as in Example 8. Then, printing is begun.

Similar results are obtained if a 20 percent sodium silicate solution is used as a coating solution.

EXAMPLE 10

An anodized aluminum plate is pretreated by dipping it into a 2 percent polyvinyl phosphonic acid solution and then coated with an aqueous solution containing 2 percent of polyacrylic acid and 0.2 percent of Rhodamine 6 GDN extra. Then, the plate is exposed to a 25 watt argon laser at a speed of 20 cm/sec and printing is then begun.

EXAMPLE 11

An aluminum plate pretreated according to Example 10 is coated with a solution of 3 percent of a low-molecular weight copolymer of methyl methacrylate and methacrylic acid (85 : 15) having an acid number of 80 – 90 and 3 percent of Rhodamine B extra in methyl ethyl ketone, and is exposed to a 25 watt argon laser at a speed of 40 cm/sec.

It will be obvious to those skilled in the art that many modifications may be made within the scope of the present invention without departing from the spirit thereof, and the invention includes all such modifications.

What is claimed is:

1. In the process for the production of a planographic printing form in which a carrier coated with a hydrophilic layer composed of a non-light-sensitive compound is imagewise exposed, the improvement comprising imagewise exposing the layer to laser radiation of an intensity and for a period such that the exposed areas are rendered hydrophobic and oleophilic, whereby the printing form obtained may be used for printing in a planographic printing machine without further treatment.

2. A process according to claim 1 in which the hydrophilic layer comprises a water-soluble, film-forming organic compound.

3. A process according to claim 2 in which the hydrophilic layer comprises a water-soluble, high-molecular weight organic compound.

4. A process according to claim 1 in which the carrier is metal.

5. A process according to claim 4 in which the carrier has a water-insoluble hydrophilic layer which comprises the reaction product of the metal surface with a monomeric or polymeric organic or inorganic acid or salts thereof.

6. A process according to claim 4 in which the carrier is aluminum.

7. A process according to claim 1 in which the hydrophilic layer additionally contains a dye as a sensitizer.

8. A planograhic printing form prepared according to the process of claim 1.

* * * * *